United States Patent
Li et al.

(10) Patent No.: US 10,763,968 B1
(45) Date of Patent: Sep. 1, 2020

(54) COHERENT/IM-DD DUAL OPERATION OPTICAL TRANSCEIVER

(71) Applicant: Google LLC, Mountain View, CA (US)

(72) Inventors: Wenzao Li, Campbell, CA (US); Ryohei Urata, San Carlos, CA (US); Xiang Zhou, Sunnyvale, CA (US); Lieven Verslegers, San Mateo, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/517,151

(22) Filed: Jul. 19, 2019

Related U.S. Application Data

(60) Provisional application No. 62/812,584, filed on Mar. 1, 2019.

(51) Int. Cl.
| | |
|---|---|
| *H04B 10/00* | (2013.01) |
| *H04B 10/50* | (2013.01) |
| *H04B 10/40* | (2013.01) |
| *H01S 3/10* | (2006.01) |
| *H01S 3/106* | (2006.01) |
| *H01S 5/00* | (2006.01) |
| *H01S 3/105* | (2006.01) |

(Continued)

(52) U.S. Cl.
CPC .......... *H04B 10/505* (2013.01); *H01S 3/105* (2013.01); *H01S 3/106* (2013.01); *H01S 3/10061* (2013.01); *H01S 5/0085* (2013.01); *H04B 10/40* (2013.01); *G02B 6/12014* (2013.01); *G02B 6/12019* (2013.01)

(58) Field of Classification Search
CPC ........ H04B 10/40; H04B 10/43; H04B 10/60; H04B 10/61; H04B 10/66
See application file for complete search history.

(56) References Cited

U.S. PATENT DOCUMENTS

| | | |
|---|---|---|
| 8,036,541 B2 | 10/2011 | Toyoshima et al. |
| 10,009,108 B2 | 6/2018 | Elahmadi et al. |

(Continued)

OTHER PUBLICATIONS

Ahn, D., et al. "High performance, waveguide integrated Ge photodetectors" Optics express, vol. 15, No. 7, pp. 3916-3921, Apr. 2, 2007.

(Continued)

*Primary Examiner* — Daniel G Dobson
(74) *Attorney, Agent, or Firm* — Lerner, David, Littenberg, Krumholz & Mentlik, LLP

(57) ABSTRACT

A dual-mode optical transceiver is disclosed. The dual-mode optical transceiver includes a receiver section configured to receive both coherently modulated and intensity modulated optical signals and to be optically switched between a first receiver mode for direct detection and a second receiver mode for coherent detection, and a transmitter section including a nested Mach-Zehnder Modulator or a polarization multiplexed quad Mach-Zehnder Modulator configured to be operated in a first transmission mode to output an intensity modulated optical signal and a second transmission mode to output a coherently modulated optical signal. In some implementations, the dual-mode optical receiver includes an optical switch configured to selectively direct a received optical signal down a direct detection optical circuit or a coherent detection optical circuit based on a control signal applied to the optical switch.

24 Claims, 6 Drawing Sheets

(51) Int. Cl.
*H04J 14/00* (2006.01)
*G02B 6/12* (2006.01)

(56) References Cited

U.S. PATENT DOCUMENTS

| | | | |
|---|---|---|---|
| 2012/0087661 A1 | 4/2012 | Look | |
| 2016/0099776 A1* | 4/2016 | Nakashima | H04B 10/50572 398/186 |
| 2016/0269110 A1* | 9/2016 | Dahan | H04B 10/0793 |
| 2016/0380698 A1* | 12/2016 | Elahmadi | H04B 10/40 398/135 |

OTHER PUBLICATIONS

Carena, A, et al. "Dynamic range of single-ended detection receivers for 100GE coherent PM-QPSK" IEEE Photonics Technology Letters, vol. 20, No. 15, pp. 1281-1283, Jul. 15, 2008.

Dong, P., et al. "50-Gb/s silicon quadrature phase-shift keying modulator" Optics express, vol. 20, No. 19, pp. 21181-21186, Sep. 10, 2012.

Erkiliç MS, et al. "Comparison of Low Complexity Coherent Receivers for UDWDM-PONs (λ-to-the-User)" Journal of Lightwave Technology, vol. 36, No. 16, pp. 3453-3464, Aug. 15, 2008.

Kikuchi, K. "Fundamentals of coherent optical fiber communications" Journal of Lightwave Technology, vol. 34, No. 1, pp. 157-179, Aug. 3, 2015.

Photonics Communications Research Laboratory, "Coherent Optical Systems, Optical Communication Networks" 47 pages.

Sotoodeh, M, et al. "Modulator bias and optical power control of optical complex E-field modulators" Journal of Lightwave Technology, vol. 29, No. 15, pp. 2235-2248, May 31, 2011.

International Search Report and Written Opinion for International Application No. PCT/US2020/018078 dated Jun. 26, 2020. 16 pages.

* cited by examiner

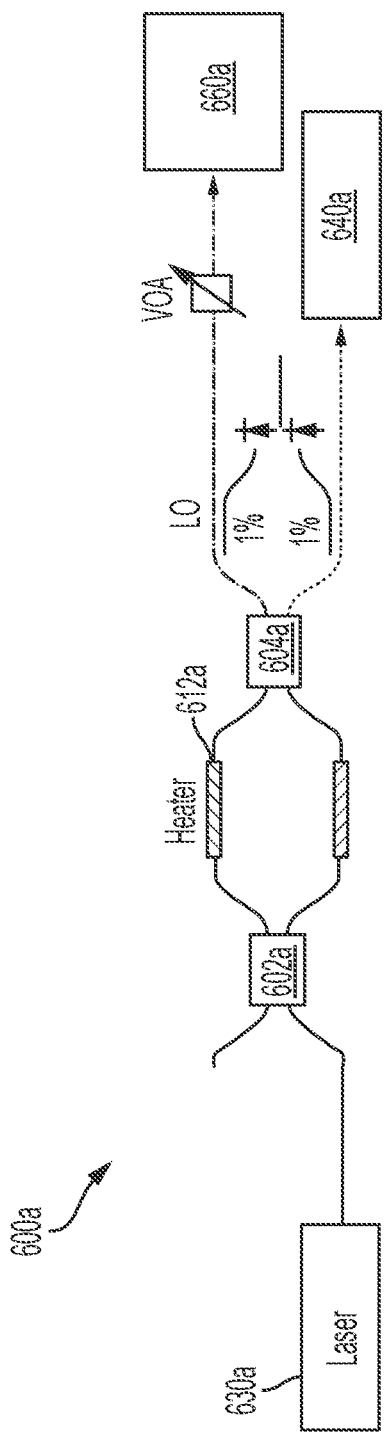
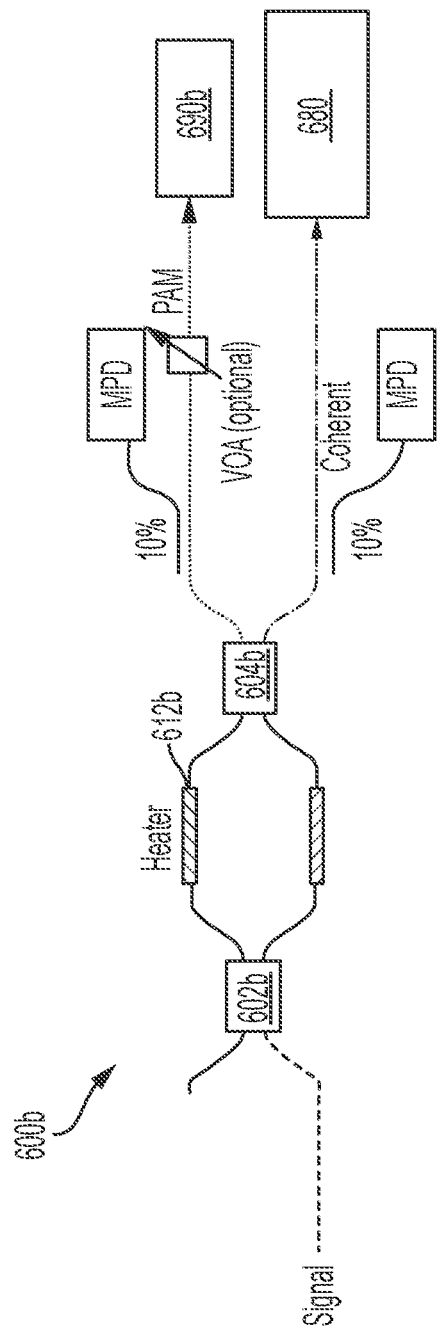
FIG. 5A
FIG. 5B

COHERENT/IM-DD DUAL OPERATION OPTICAL TRANSCEIVER

RELATED APPLICATIONS

The present application claims priority to and the benefit of U.S. Provisional Patent Application No. 62/812,584, titled "COHERENT/IM-DD DUAL OPERATION OPTICAL TRANSCEIVER" and filed on Mar. 1, 2019, the entire contents of which are hereby incorporated by reference for all purposes.

BACKGROUND

Fiber-optics provides high bandwidth data center interconnection (DCI) for data center networks. Existing intra-data center interconnection technologies use intensity modulation (IM) and direction detection (DD) technology. However, the existing IM-DD approach does not scale well with bandwidth growth as data consumption rises. Continuous growth in DCI bandwidth demand and consumption, for example, to support over 100 Gb/s of data transmission per wavelength using IM-DD, can be technologically challenging and expensive to implement.

Coherent optics is an alternative approach suitable for high bandwidth DCI for data center networks. However, due to the evolutionary nature of data center networks, the un-proven next generation technologies, such as those based on coherent optics, must be backward compatible with the existing technology for a large scale datacenter network. Implementing the network to be partially and seamlessly upgraded, without needing to upgrade the entire data center all at once can be both cost prohibitive and impractical. As a result, a challenge remains on how to make the coherent optics technology backward compatible with the existing IM-DD technology to better bridge the current and future technologies.

SUMMARY

At least one aspect is directed to a photonic integrated chip (PIC). The PIC includes a receiver section configured to receive both coherently modulated and intensity modulated optical signals and to be optically switched between a first receiver mode for direct detection and a second receiver mode for coherent detection. The PIC also includes a transmitter section including a nested Mach-Zehnder Modulator or a polarization multiplexed quad Mach-Zehnder Modulator configured to be operated in a first transmission mode to output an intensity modulated optical signal and a second transmission mode to output a coherently modulated optical signal.

In some implementations, the receiver section detects both the coherently modulated and intensity modulated optical signals using at least one common photodiode. In some implementations, the photodiode comprises a waveguide photodiode.

In some implementations, the PIC is coupled to a digital signal processor (DSP) for decoding the received coherently modulated and intensity modulated optical signals. In some implementations, the PIC further includes an optical switch configured to selectively direct a received optical signal down a direct detection optical circuit or a coherent detection optical circuit based on a control signal applied to the optical switch.

In some implementations, the nested Mach-Zehnder Modulator includes a controllable phase shifter coupled to one Mach-Zehnder Modulator in the nested Mach-Zehnder Modulator, wherein in the first transmission mode, the controllable phase shifter implements a first phase shift and in the second transmission mode, the controllable phase shifter implements a second phase shift.

In some implementations, the controllable phase shifter comprises a heater configured to introduce a thermo-optic phase shift in the output of the one Mach-Zehnder Modulator. In some implementations, the first phase shift is a zero phase shift and the second phase shift is a $\pi/2$ phase shift.

In some implementations, the PIC further includes at least one demultiplexer coupled to the receiver section for receiving coarse wavelength division multiplexed, intensity modulated optical signals and a multiplexer coupled to the transmitter section to transmit wavelength division multiplexed, intensity modulated optical signals.

In some implementations, the PIC is coupled to a controller configured to cause the PIC to switch between receiver and transmission modes.

At least one aspect is directed to a method operating. The method includes providing a source configured for generating optical signals and providing a transceiver. The transceiver includes a receiver section configured to receive both coherently modulated and intensity modulated optical signals and to be optically switched between a first receiver mode and a second receiver mode, and a transmitter section comprising a nested Mach-Zehnder Modulator or a polarization multiplexed quad Mach-Zehnder Modulator configured to be operated in a first transmission mode and a second transmission mode. The method also includes transmitting, via the transmitter section, in the first transmission mode an intensity modulated optical signal or in the second transmission mode a coherently modulated optical signal. The method further includes receiving an optical signal, via the receiver section, in the first receiver mode for direct detection or in the second receiver mode for coherent detection.

In some implementations, receiving includes detecting both the coherently modulated and intensity modulated optical signals using at least one common photodiode. In some implementations, the photodiode comprises a waveguide photodiode.

In some implementations, the method further includes decoding the received coherently modulated and intensity modulated optical signals using a digital signal processor (DSP). In some implementations, the method also includes selectively directing using an optical switch a received optical signal down a direct detection optical circuit or a coherent detection optical circuit based on a control signal applied to the optical switch.

In some implementations of the method, the nested Mach-Zehnder Modulator includes a controllable phase shifter coupled to one Mach-Zehnder Modulator in the nested Mach-Zehnder Modulator, wherein in the first transmission mode, the controllable phase shifter implements a first phase shift and in the second transmission mode, the controllable phase shifter implements a second phase shift.

In some implementations of the method, the controllable phase shifter comprises a heater configured to introduce a thermo-optic phase shift in the output of the one Mach-Zehnder Modulator. In some implementations, the first phase shift is a zero phase shift and the second phase shift is a $\pi/2$ phase shift.

In some implementations, the method further includes demultiplexing received coarse wavelength division multiplexed, intensity modulated optical signals and transmitting coarse wavelength division multiplexed intensity modulated optical signals. In some implementations, the method further includes switching between receiver and transmission modes in response to a controller command.

At least one aspect is directed to a transceiver. The transceiver includes a receiver section configured to receive both coherently modulated and intensity modulated optical signals, a transmitter section comprising an optical modulator configured to be operated in a first transmission mode to output an intensity modulated optical signal and a second transmission mode to output a coherently modulated optical signal, and a digital signal processor (DSP) for decoding the received coherently modulated and intensity modulated optical signals.

In some implementations, the optical modulator includes a nested Mach-Zehnder Modulator or a polarization multiplexed quad Mach-Zehnder Modulator. In some implementations, the nested Mach-Zehnder Modulator comprises a controllable phase shifter coupled to one Mach-Zehnder Modulator in the nested Mach-Zehnder Modulator, wherein in the first transmission mode, the controllable phase shifter implements a first phase shift and in the second transmission mode, the controllable phase shifter implements a second phase shift.

In some implementations, the receiver section is configured to optically switch between a first receiver mode for direct detection and a second receiver mode for coherent detection. In some implementations, the transceiver is coupled to a controller configured to cause the transceiver to switch between receiver and transmission modes.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings:

FIGS. 5A and 5B show schematic diagrams of example implementations of Mach-Zehnder Interferometer optical switches.

DETAILED DESCRIPTION

Figure 1:
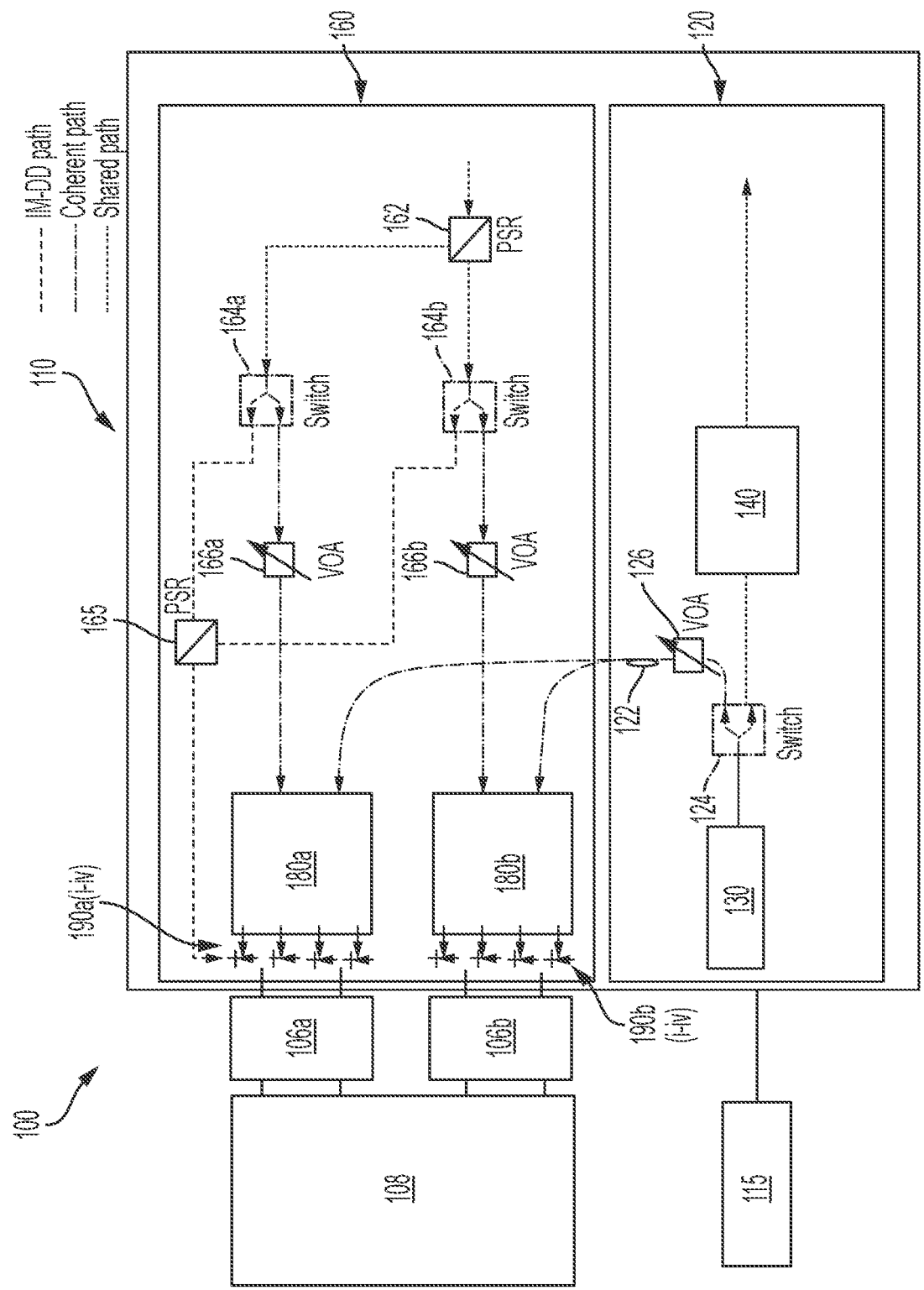
FIG. 1 shows a schematic diagram of an implementation of a single channel dual-mode optical transceiver, according to an illustrative implementation.

In the IM-DD approach currently deployed in intra-datacenter networks, a transmitted optical signal is modulated with a non-return-to-zero (NRZ) on-off-keying (OOK) format. In some IM-DD schemes recently developed, a 4-level pulse-amplitude modulation (PAM-4) format is used for modulating the optical signal. Within the current schemes, the transmitted optical signal intensity is typically received by a photodetector (PD) in the optical network. Most current IM-DD approaches use a simple and low cost solution for long-reach (LR) optical links using wavelengths in the O-band (around 1310 nm), typically covering up to a distance of 10 km.

Unlike the IM-DD approach, the coherent optical approach is based on modulation of a signal onto the amplitude and phase of the optical wave, instead of optical intensity. In the coherent approach, the transmitted optical signal is received by coherent detection, where the signal is mixed with a second optical wave called a local oscillator (LO) through a combination of different phase delays between the signal and LO, and finally detected on a plurality of PDs. The detected photocurrents in the PDs are subsequently processed by a digital signal processor (DSP) to demodulate the signal in the receiver unit.

Current coherent optical communication technology is mainly used in long-haul, submarine, and more recently metro networks, due to its benefits of high spectral efficiency, high sensitivity and resilience to fiber transmission impairments. The optical wavelength is usually in the C-band (around 1550 nm), due to the availability of the erbium-doped fiber amplifier (EDFA). Despite the advantages of coherent optics, its high complexity, high cost and incompatible operating wavelength make it prohibitive for implementation in currently existing intra-data center interconnects.

Due to the advancement of photonic integrated circuit (PIC) technology, it is possible to develop a low cost, highly integrated coherent optical transceiver for intra data center interconnects. However, the integration of the PIC and coherent optical receiver technologies cannot be implemented in data center networks without ensuring backward compatibility with existing IM-DD technologies. The challenge to make the coherent optical technology backward compatible with the existing IM-DD technologies, and the need for bridging current and future technologies culminate into the development of the transceiver technology as disclosed herein.

As described in various embodiments and implementations herein, a dual-mode optical transceiver and related technologies disclosed in the application can be implemented in data center networks and can be seamlessly integrated with both existing IM-DD technologies and coherent optical technologies. The disclosure relates to a dual-mode optical transceiver that supports both IM-DD and coherent optical technologies (IM-DD/Coherent transceiver) and a method of operating the IM-DD/Coherent transceiver. Specifically, the disclosure relates to an IM-DD/Coherent transceiver having a receiver section configured to receive both intensity modulated (IM) and coherently modulated (CM) optical signals. In some implementations, the IM-DD/Coherent transceiver can be optically switched between a first receiver mode for direct detection (DD) and a second receiver mode for coherent detection (CD). The disclosure also relates to an IM-DD/Coherent transceiver having a transmitter section configured to transmit both IM and CM optical signals. In some implementations, the IM-DD/Coherent transceiver includes a nested Mach-Zehnder Modulator or a polarization multiplexed quad Mach-Zehnder Modulator that is configured operate in a first transmission mode to output an IM optical signal and a second transmission mode to output a CM optical signal.

FIG. 1 shows a schematic diagram of a single channel dual-mode optical transceiver 100, according to an illustrative implementation. The transceiver 100 shown in FIG. 1 includes a photonic integrated circuit (PIC) 110 that is connected to a digital signal processing (DSP) 108 via transimpedance amplifiers (TIAs) 106a and 106b. As shown in FIG. 1, the PIC 110 of the transceiver 100 includes a transmitter 120 and a receiver 160. The transmitter 120 further includes a laser source 130, an optical switch 124, a variable optical attenuator (VOA) 126, a light splitter 122, and an optical modulator 140. The receiver 160 further includes a polarization splitter rotator (PSR) 162, optical switches 164a and 164b, VOAs 166a and 166b, a PSR 165, two 90 degree optical hybrids 180a and 180b, four photodiodes (PDs) 190a(i-iv), and four PDs 190b(i-iv).

In some implementations, the PIC 110 can include the DSP 108 and/or TIAs 106a and 106b, along with the components in the transmitter 120 and the receiver 160. In other words, the transceiver 100 can include all the components shown in FIG. 1, according to some implementations. In some implementations, the PIC can include TIAs 106a and 106b, the transmitter 120, and the receiver 160.

In some implementations, the TIAs 106a and 106b can include any impedance amplifier suitable for amplifying an electrical current. In some implementations, the TIAs 106a and 106b are quad channel TIAs for coherent receivers.

In some implementations, the DSP 108 can include any digital signal processor suitable for this application. The DSP 108 is configured to carry out processing functions used in both IM and CM transmission and reception, such as converting digital signals into modulator drive signals for both IM and CM transmission, as well as symbol recovery for IM and CM receiving. The transceiver 100, in some implementations, includes a separate integrated circuit processor 115, such as an ASIC, FPGA, or microprocessor to carry out the control functionality described herein.

In some implementations, the transmitter 120 of the transceiver 100 is configured to be operated in a first transmission mode to output an intensity modulated optical signal and a second transmission mode to output a coherently modulated optical signal. In some implementations, the receiver 160 of the transceiver 100 is configured to receive both coherently modulated and intensity modulated optical signals and to be optically switched between a first receiver mode for direct detection of intensity modulated signals and a second receiver mode for coherent detection of coherently modulated optical signals.

As shown in FIG. 1, the transmitter 120 includes the laser source 130 configured to provide a laser light. The transmitter 120 also includes the optical switch 124, the VOA 126, the light splitter 122, and the optical modulator 140 where the laser light is manipulated as it transits through the components. In some implementations, the laser light from the laser source 130 is transmitted into the optical switch 124 that is configured for controllably distributing the optical power of the laser according to the operating mode of the transmitter 120. For example, when operating in the IM mode (also referred to herein as "pulse-amplitude modulation (PAM) mode"), the optical switch can be controlled to direct all of the light output by the laser source 130 to the modulator 140. When operating in the CM mode (also referred to herein as "quadrature-amplitude modulation (QAM) mode"), the optical switch can be controlled to split the light emitted by the laser source 130 between the modulator 140 and the optical hybrids 180a and 180b to serve as a local oscillator. In some implementations, in the CM mode, the optical switch 124 distributes the optical power to the modulator 140 and the 90° optical hybrids 180a and 180b according to the ratios 10:90, 30:70, 50:50, 70:30, or 90:10 or any ratios therebetween.

In some implementations, the laser source 130 is integrated in the transmitter 120. In some implementations, the laser source 130 is a standalone unit, die, or module that is attached to the transmitter 120. In some implementations, the laser source 130 is integrated in the PIC 110. In some implementations, the laser source 130 is a standalone unit, die, or module that is attached to the PIC 110.

In some implementations, the optical hybrids 180a and 180b can include a 90° optical hybrid. As would be understood by a person of ordinary skill in the art, a 90° optical hybrid is an optical component that generates four interference signals by combining two optical signals together, imparting on one of the signals four different phase delays, each separated by 90°, hence the inclusion of the four photodiodes 190a(i-iv) and 190b(i-iv) coupled to each optical hybrid 180a and 180b. In some implementations, a 90° optical hybrid with single ended detection may be used, instead, yielding two interference signals. In such implementations, only two photodiodes may be needed per optical hybrid.

In some implementations, the optical modulator 140 is a nested Mach-Zehnder modulator (n-MZM). In some implementations, a Mach-Zehnder modulator (MZM) can be used for intensity modulation. In some implementations, two MZMs can be used in parallel as a n-MZM, and the n-MZM can be used for coherent modulation. In some implementations, the optical modulator 140, e.g., a n-MZM, is configured to perform both IM and CM.

As shown in FIG. 1, the receiver 160 includes the PSR 162 configured for receiving transmitted optical signal and splitting the optical signal into two polarization components. The receiver 160 also includes the optical switches 164a and 164b, the VOAs 166a and 166b, the PSR 165, and the optical hybrids 180a and 180b. The optical hybrid 180a is connected to the PDs 190a(i-iv), and the optical hybrid 180b is connected to the PDs 190b(i-iv). As shown in FIG. 1, each of the four PDs 190a(i-iv) and four PDs 190b(i-iv) are connected to one of the TIAs 106a or 106b that are connected to the DSP 108. In some embodiments, the PDs can be balanced dual-input waveguide photodetectors. In some implementations, the PDs can be single-ended photodiodes. The use of single-ended photodiodes can improve yield, but may come at the cost of sensitivity (about 3 dB) and lack of common mode suppression provided by balanced photodetectors.

As disclosed herein and illustrated in FIG. 1, the transceiver 100 is configured to operate in both an IM mode and a CM mode. When the receiver 100 is configured to operate in the IM mode, the optical paths through the PIC 110 are referred to as IM (for transmission) or DD (for receiving) optical paths. When the transceiver 100 is configured to operate in the CM mode, the optical paths through the PIC 110 are referred to as coherent optical paths.

As shown in FIG. 1, when operating in the CM mode, the coherent path for transmission begins at the laser source 130, which generates and outputs laser light to the optical switch 124. The optical switch splits the beam and sends a portion of the optical energy of the laser beam of light to the optical hybrids 180a and 180b via the VOA 126 and the light splitter 122. This laser light is used as a local oscillator for coherent detection of coherently modulated received optical signals. The remainder of the optical energy output by the laser source 130 travels through the PIC 110 to the optical modulator 140. The modulator 140 coherently modulates the light and transmits the modulated light outward to an output fiber.

As shown in FIG. 1, when operating in the IM mode for transmission in the transceiver 100, the optical switch 124 is controlled to pass all of the optical energy of the light emitted by the laser source 130 to the optical modulator 140. The optical modulator 140 modulates the laser light via intensity modulation and then transmits the modulated light outward to an output fiber. Accordingly, the light output onto the output fiber in both the IM and CM modes travels the same optical path, through the same optical components.

With respect to optical signals received by the transceiver 100, as shown in FIG. 1, in both the IM and CM operating modes, the respective optical paths begins at the PSR 162, which splits the light into its two constituent polarizations, passing each polarization component to a respective optical switch 164a or 164b. At the optical switches 164a and 164b, the paths light traverses varies based on the operating mode of the transceiver 100. In the IM mode, the optical switches 164a and 164b are controlled to direct light received at each optical switch to the PSR 165, which serves to recombine the optical two polarization components of the received signal and direct them to one of the photodiodes (e.g., 190a(i)) of one of the optical hybrids (e.g., 180a). In the CM mode, optical switches 164a and 164b are controlled to direct the light at respective optical switches 164a and 164b to respective optical hybrids 180a and 180b via VOAs 166a and 166b. At the optical hybrids, each polarization component signal is combined with local oscillation optical signals delayed by various phase delays. For example, in the implementation shown in FIG. 1, in which the optical hybrids are 90° optical hybrids, the polarization component signals are combined with 4 local oscillator signals, each separated in phase by 90°. The resultant interference signals are detected by respective photodiodes 190a(i-iv) and 190b(i-iv). The electrical outputs of the photodiodes are fed through the TIAs 106a and 106b to the DSP 108 for symbol recovery.

As mentioned above, in some implementations, the PIC 110 is coupled to a controller separate from the DSP and one or more drivers configured to control the optical switches 124, 164a and 164b, the VOAs 126, 166a, and 166b, and the optical modulator 140 of the PIC 110. In some implementations, the controller can be implemented, e.g., as a microcontroller unit, an integrated circuit logic unit, or as a software-controlled microprocessor.

In some implementations, the dual-mode optical transceiver 100 that operates in a single channel IM-DD/Coherent transceiver configuration shown in FIG. 1 can be used as the basis for a multi-channel dual-mode transceiver using parallel single mode (PSM) or wavelength division multiplexing (WDM) technologies.

Figure 2:
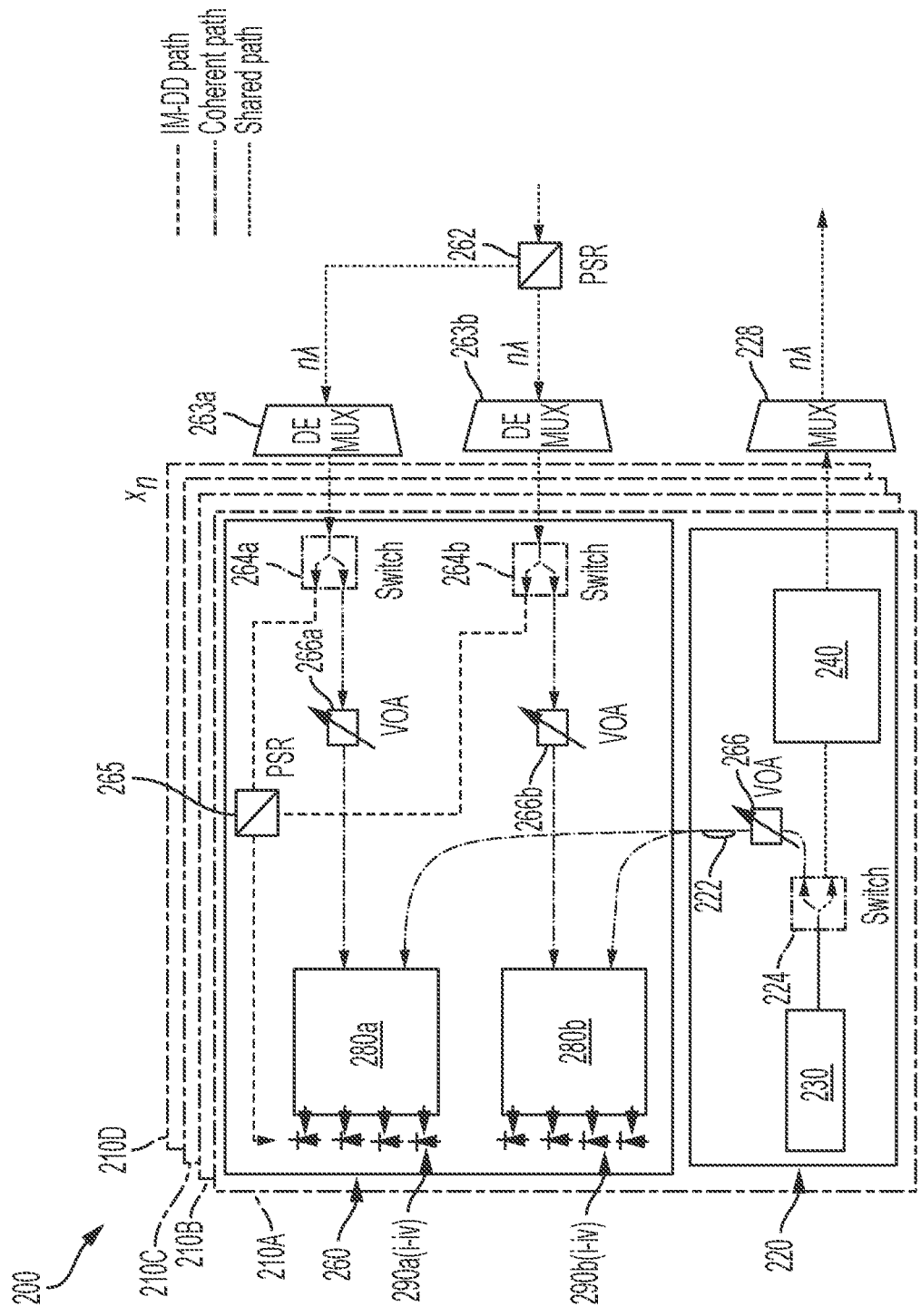
FIG. 2 shows a schematic diagram of another implementation of a wavelength division multiplexed dual-mode optical transceiver, according to an illustrative implementation.

FIG. 2 shows a schematic diagram of one implementation of a multi-channel dual-mode optical transceiver 200, according to an illustrative implementation. As shown in FIG. 2, the dual-mode transceiver 200 is configured to operate as a n-wavelength (nλ) WDM transceiver implemented in a multi-channel IM-DD/Coherent transceiver configuration. As shown in FIG. 2, the transceiver 200 includes a plurality of PICs 210A, 210B, 210C, and 210D (collectively referred to as PICs 210). In some implementations, a multi-channel or WDM transceiver configuration can be implemented on a single PIC, instead of multiple PICs, or one PIC per channel. As shown in FIG. 2, each of the PICs 210 in the transceiver 200 is configured to transmit and receive optical signals at wavelengths that differ from the other PICs 210 in the transceiver. As shown in FIG. 2, each of the PICs 210A, 210B, 210C, and 210D is configured substantially similar to the PIC 110 shown in FIG. 1, with similar reference numerals corresponding to substantially similar components. For example, the optical switches 224, 264a, and 264b in FIG. 2 correspond to the optical switches 124, 164a and 164b in FIG. 1. Similarly, the VOAs 226, 266a, and 266b correspond to the VOAs 126, 166a and 166b in FIG. 1; the optical modulator 240 in FIG. 2 corresponds to the optical modulator 140 in FIG. 1, and so forth. While each PIC 210 has its own laser source 230 associated with it (integrated or optically coupled), each laser source 230 is configured to output a different wavelength of light. Accordingly, the transceiver 200 can be controllably switched between operating in a CM mode or an IM mode. In some implementations, some PICs may operate in the IM mode while other PICs operate in the CM mode. In some other implementations, all PICs operate in the same mode at any given time, IM mode or CM mode.

While most of the components shown in FIG. 1 are replicated in each of the PICs 210A-210D, the transceiver 200, in some implementations may only include a single PSR 262 for an optical signal, which splits the received WDM signal into its constituent polarization components prior to those polarization components being separated by wavelength by respective demultiplexers 263a and 263b, which direct the wavelength specific signals to corresponding PICs 210. In some other implementations, the transceiver 200 may include a single demultiplexer and a separate PSR 262 for each PIC. In addition to the demultiplexers 263a and 263b, the transceiver 200 includes a multiplexer 228 to combine the outputs of the modulators 240 of the respective PICs 210 into a combined WDM output optical signal. The transceiver can have a single DSP to process the amplified electrical outputs of all of the PICs 210, or it can include multiple DSPs to process the electrical outputs of individual or subsets of the PICs 210.

Figures 3A, 3B, 3C:
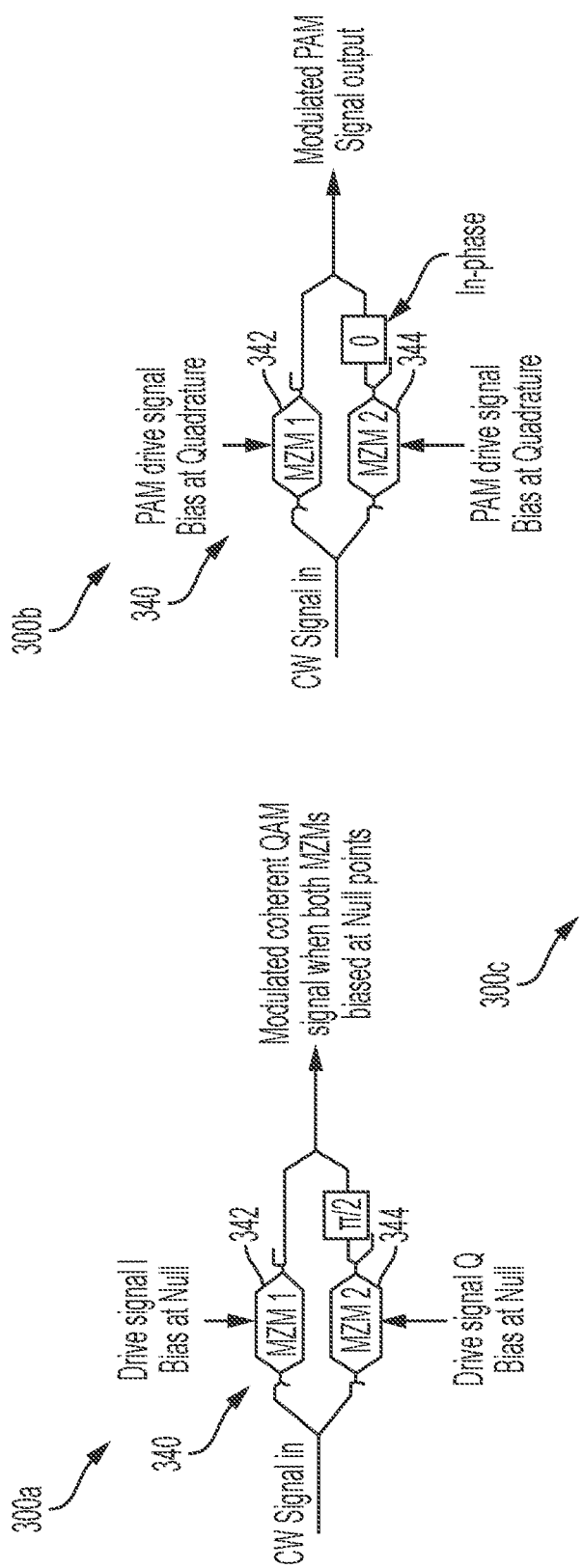
FIGS. 3A, 3B, and 3C show schematic diagrams showing operational schemes of a nested Mach-Zehnder Modulator, according to an illustrative implementation.

FIGS. 3A, 3B, and 3C show schematic diagrams showing operational schemes of a nested Mach-Zehnder Modulator (n-MZM) 340, that be used as the optical modulators 140 or 240 shown in FIGS. 1 and 2. FIG. 3A shows an operational scheme 300a for the n-MZM 340 for standard coherent modulation of a laser. As shown in FIG. 3A, a continuous wave signal is input across MZM 342 and MZM 344 of the n-MZM 340. Both MZMs 342 and 344 are biased at their null point and are driven by respective I and Q drive signals. The output of the MZM 344 driven by the Q drive signal passes through a phase delay, e.g., a π/2 phase delay) before being combined with the output of the MZM 342, which is driven by the I drive signal.

FIG. 3B shows an example operational scheme 300b to generate an IM signal using the same n-MZM 340. The operational scheme 300b uses the same electrical driving signals (a pulse amplitude modulation (PAM) drive signal) to drive both MZMs 342 and 344. Both MZMs 342 and 344 are biased at their respective quadrature points. Therefore, the outputs from both MZMs 342 and 344 are identical IM signals. As shown in FIG. 3B, the relative phase shift between the outputs from the two MZMs 342 and 344 is 0. Therefore, the two identical IM signals are constructively combined to form a single IM signal as shown in FIG. 3B.

FIG. 3C shows an alternative operational scheme 300c to generate the IM signal using the same n-MZM 340. The operational scheme 300c drives one of the MZMs 342 or 344 with a PAM drive signal and a null bias. The other MZM 342 or 344 is not driven, and is based at its maximum. The relative phase shift between the outputs from the two MZMs 342 and 344 is 0. The combined output is again a single PAM signal.

In some implementations, the phase shifter on the MZM 344 can be implemented by placing a heater close to the optical waveguide, and the phase of the optical signal is then controlled by the heater, leveraging the thermo-optic effect. As indicated above, in the CM mode, the phase shifter is controlled to achieve a phase shift of $\pi/2$ between the two MZMs 342 and 344. In some implementations, in the IM mode, the phase shifter is controlled to achieve a phase shift of 0 between the two MZMs 342 and 344.

Figure 4:
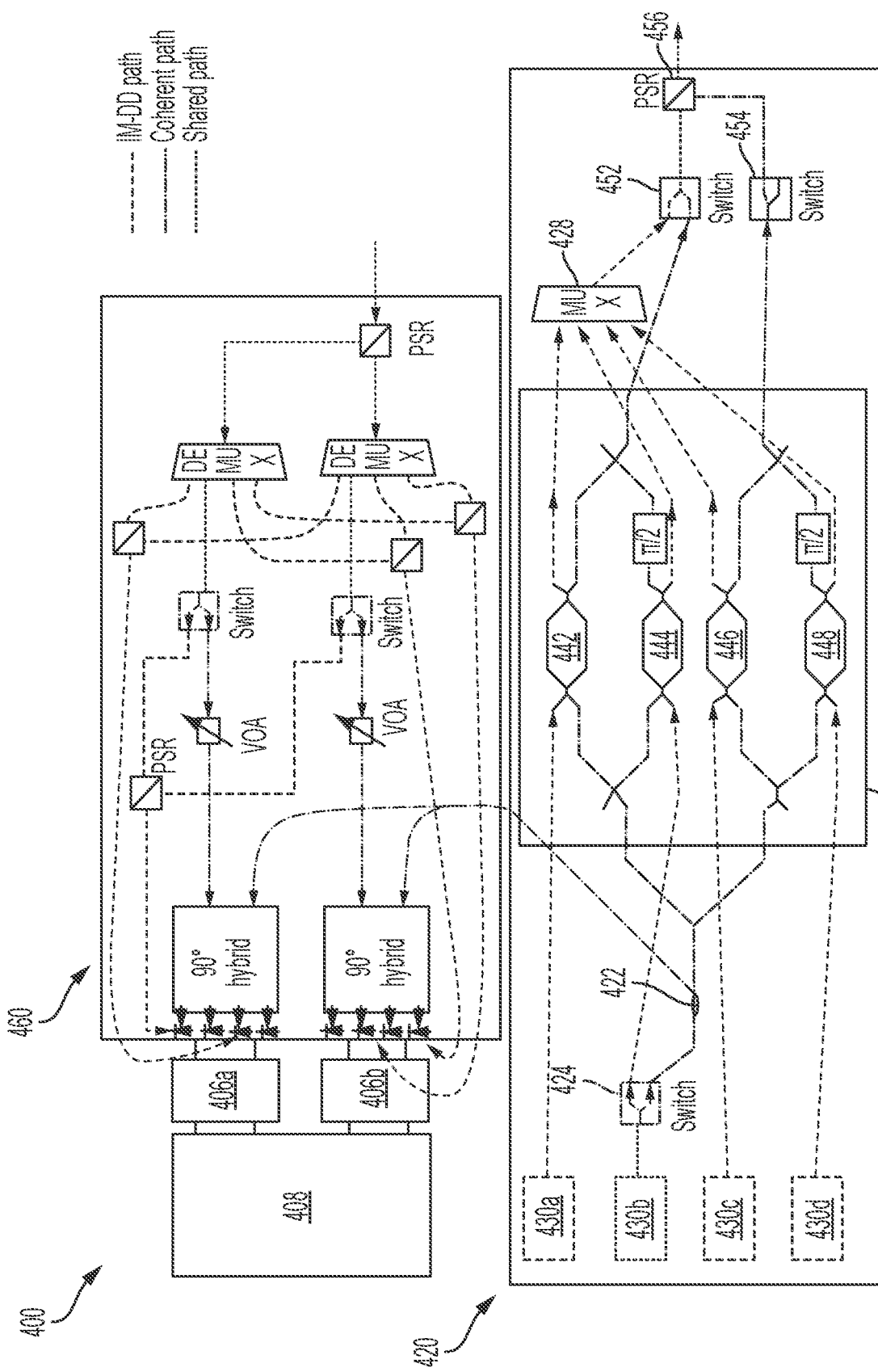
FIG. 4 shows a schematic diagram of another implementation of a wavelength division multiplexed dual-mode optical transceiver, according to an illustrative implementation.

FIG. 4 shows a schematic diagram of another implementation of a wavelength division multiplexed dual-mode optical transceiver 400, according to an illustrative implementation. The transceiver 400 is configured for dual operations in a 1-channel PM-xQAM coherent mode and a 4-channel Coarse Wavelength Division Multiplexing (CWDM4) IM-DD mode. As shown in FIG. 4, the transceiver includes a transmitter 420 and a receiver 460 that is connected to a DSP 408 via TIAs 406a and 406b. The receiver 460 is similar to the receiver 160. However, the transmitter 420 is configured differently than the transmitters 120 and 220.

As shown in FIG. 4, the transmitter 420 includes four laser sources 430a, 430b, 430c and 430d with each outputting a different wavelength, an optical switch 424, an optical splitter 422, an optical modulator 440 that includes four MZMs 442, 444, 446, and 448, a MUX 428, two more optical switches 452 and 454, and a PSR 456. In particular, the transmitter 420 uses the optical modulator 440, which is a polarization multiplexed quad Mach-Zehnder modulator (PM-QMZM) 440, instead of the n-MZM 140, 240 or 340 as shown in FIGS. 1-3. The configuration illustrated in FIG. 4 utilizes a scheme where each of the 4 MZMs 442, 444, 446, and 448 in the PM-QMZM 440 has 2 input ports and 2 output ports.

As shown in FIG. 4, the receiver 460 includes five PSRs, two DEMUXs, two optical switches, two VOAs, two 90 degree optical hybrids, and eight PDs. In particular, the PDs are dual input waveguide PDs and four of them connect one end to coherent signal inputs and connect the other end to intensity modulated signal inputs.

When operating in CM mode of the transceiver 400, a single laser, for example 430b, is turned on, and its output is split between the four MZMs of the PM-QMZM 440 via the optical switch optical splitters. For each constituent polarization of the laser light output, a portion is sent an upper arm of an MZM and a portion is sent to a lower portion another MZM. Phase delays are instituted on the outputs of the MZMs receiving the optical signal at their upper arms. Each of the four MZM is then driven with a corresponding I or Q drive signal, while biased at their respective null points. The outputs of the MZMs are then combined for output on an optical fiber. In the CM mode, a portion of the light output by the laser source 430b is also directed to the receiver portion 460 of the transceiver 400 to serve as a local oscillator signal. The remaining three lasers, in this example 430a, 430c, and 430d, can remain off.

When operating in IM-DD CWDM4 mode, all four lasers at different wavelengths are input into the four MZMs of the PM-QMZM 440, which are driven with independent PAM drive signals, while biased at quadrature points just like traditional IM MZMs. The outputs of the MZMs are then multiplexed together via the multiplexer 428 before being switched onto an optical fiber via optical switch 452.

As shown in FIG. 4, the receiver 460, when operating in CM mode, operates similarly to the receiver 160 shown in FIG. 1. That is, each polarization of component of a single wavelength of light is switched to an optical hybrid to be mixed with a local oscillator, yielding multiple interference signals. The interference signals are detected using photodetectors, the outputs of which are forwarded to a DSP for symbol decoding.

The receiver 460, when operating in IM mode, operates in a fashion that is a hybrid between the receiver 160 and the receiver 260 shown in FIGS. 1 and 2. In contrast with the receiver 260, which includes one set of optical hybrids and PDs for each wavelength channel, in the receiver 460, there is one set of two 90° hybrid and eight PDs for all four wavelength channels. Specifically, the receiver 460 receives a WDM optical signal, which after it splits into its constituent polarization components, the receiver 460 further splits into its component wavelengths using demultiplexers. The two constituent polarization components of each wavelength are then directed to a polarization combiner via an optical switch. These combined signals are then directed to respective photodiodes, so a different photodiode receives each of the different recombined optical signals having their respective wavelengths. The photodiode outputs are output to one or more DSPs for symbol detection. Accordingly, like the receiver 260, the receiver 460 can carry out direct detection on a WDM optical signal, but like receiver 160, such detection can be carried out on a single PIC without additional optical hybrids and photodetectors.

As discussed above, the various implementations of the dual-mode transceiver described herein include multiple optical switches. In some implementations, one or more of such switches can be implemented using an active Mach-Zehnder interferometer (MZI) switch, which includes a symmetrical MZI and a heater (or other phase shifter). Heater-based phase shifters actively control and change the refractive index of a waveguide through the thermo-optic effect. Leveraging the thermo-optic effect, the optical switch is configured to alter the optical interference at the output coupler (e.g., a 3 dB coupler) thereby switching optical power from one output port to another. For coherent operation, the optical switch in the transceiver transmitter portion can be controlled such that half of the laser source power is output to the modulator, and the other half to is output to the optical hybrids as a local oscillator signal. For IM mode transmitter operation, the optical switch can be controlled to direct all the laser power to the MZM.

FIGS. 5A and 5B show schematic diagrams of an implementation of a Mach-Zehnder Interferometer (MZI) switch used in the transmitter portion and receiver portion, respectively, of a dual mode transceiver as described herein. FIG. 5A shows an implementation of the active MZI switch 600a for use in a transmitter portion, such as the transmitter portion 160 of the transceiver 100. The MZI switch 600a includes a laser 630a, a 3 dB coupler 602a, heaters 612a, a 3 dB coupler 604a, a modulator 640a and a receiver 660a. The laser 630a and the modulator 640a are connected on the same side of the MZI switch (bottom path) and the receiver 660a is connected to the other side, across from the laser 630a (cross path). According to some implementations, the configuration shown in FIG. 5A improves or maximizes the extinction ratio (ER) of the MZI switch 600a when operating in IM-DD mode, especially when there are imperfections in the 3 dB couplers 602a and 604a.

FIG. 5B shows the implementation of a MZI switch 600b, according to an illustrative implementation. FIG. 5B shows an implementation of the MZI switch 600b suitable for use in the receiver portion of a dual-mode transceiver, such as the receiver 160 shown in FIG. 1. The MZI switch 600b includes a signal input, a 3 dB coupler 602b, heaters 612b, a 3 dB coupler 604b, a PD 690b, and an optical hybrid 680. As shown in FIG. 5B, an input signal and the optical hybrid 680 are connected on the same side of the MZI switch 600b (bottom path) and the direct detection path towards the PD 690b is on the other side, across from the input signal (cross path). According to some implementations, the configuration shown in FIG. 5B improves or maximizes the ER of the MZI switch 600b when operating in coherent mode, especially when there are imperfections in the 3 dB couplers.

Figure 6:
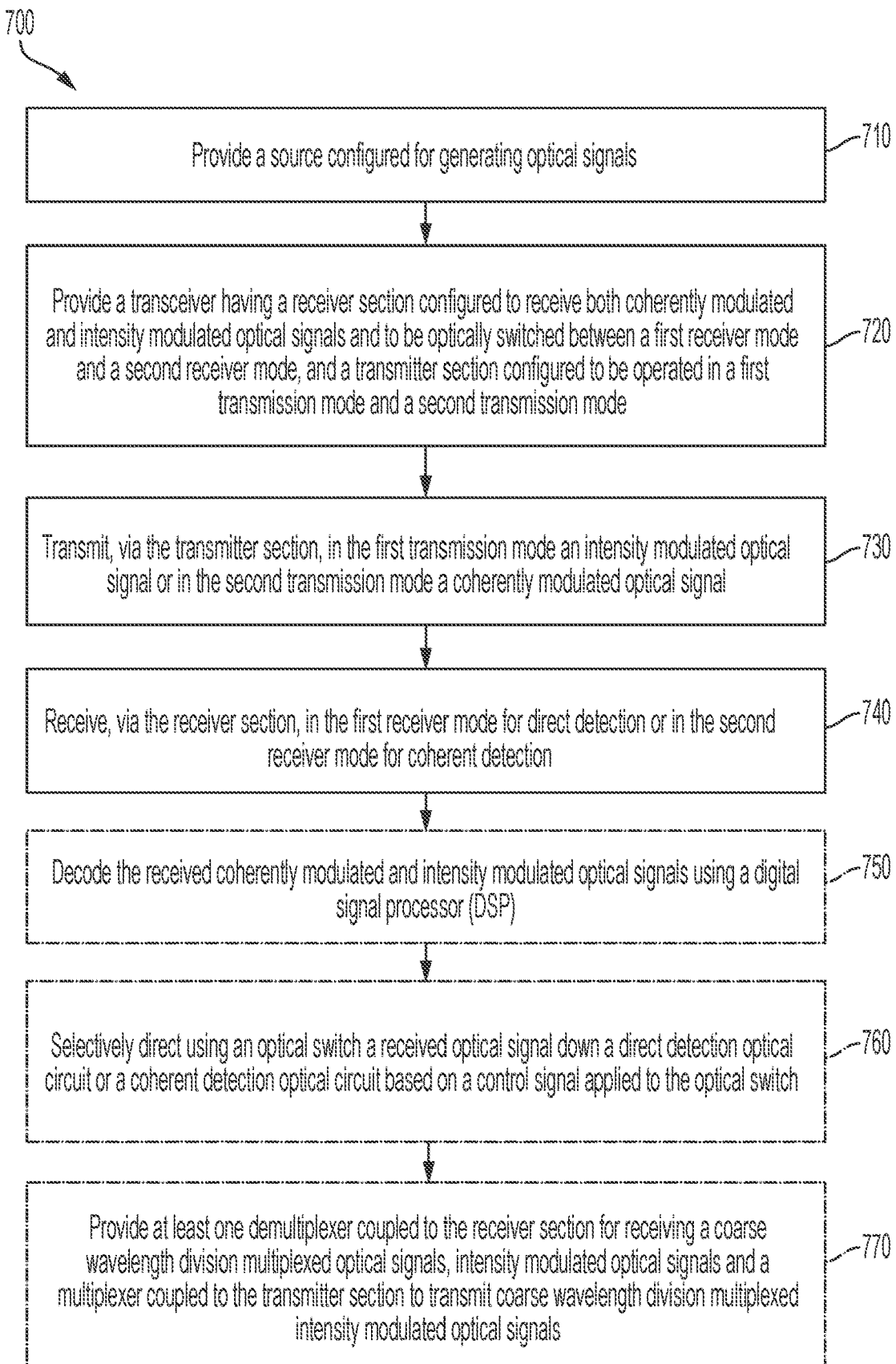
FIG. 6 is a flowchart of an example method of operating a dual-mode optical transceiver, according to an illustrative implementation.

FIG. 6 is a flowchart of an example method 700 of operating a dual-mode optical transceiver, according to an illustrative implementation. The method 700 includes providing a source configured for generating optical signals at stage 710. The method 700 also includes providing a transceiver having a receiver section configured to receive both coherently modulated and intensity modulated optical signals and to be optically switched between a first receiver mode and a second receiver mode, and a transmitter section configured to be operated in a first transmission mode and a second transmission mode at stage 720. The transmitter section can include a nested Mach-Zehnder Modulator or a polarization multiplexed quad Mach-Zehnder Modulator.

The method 700 also includes transmitting, via the transmitter section, in the first transmission mode an intensity modulated optical signal or in the second transmission mode a coherently modulated optical signal at stage 730. The method 700 further includes receiving, via the receiver section, in the first receiver mode for direct detection or in the second receiver mode for coherent detection at stage 740. In some implementations, receiving includes detecting both the coherently modulated and intensity modulated optical signals using at least one common photodiode. In some implementations, the photodiode comprises a waveguide photodiode.

In some implementations, the method 700 optionally includes providing a digital signal processor (DSP) for decoding the received coherently modulated and intensity modulated optical signals at stage 750. In some implementations, the method 700 optionally includes providing an optical switch configured to selectively direct a received optical signal down a direct detection optical circuit or a coherent detection optical circuit based on a control signal applied to the optical switch at stage 760.

In some implementations of the method, the nested Mach-Zehnder Modulator includes a controllable phase shifter coupled to one Mach-Zehnder Modulator in the nested Mach-Zehnder Modulator, wherein in the first transmission mode, the controllable phase shifter implements a first phase shift and in the second transmission mode, the controllable phase shifter implements a second phase shift.

In some implementations of the method, the controllable phase shifter comprises a heater configured to introduce a thermo-optic phase shift in the output of the one Mach-Zehnder Modulator. In some implementations, the first phase shift is a zero phase shift and the second phase shift is a $\pi/2$ phase shift.

In some implementations, the method 700 optionally includes providing at least one demultiplexer coupled to the receiver section for receiving a coarse wavelength division multiplexed, intensity modulated optical signal and a multiplexer coupled to the transmitter section to transmit coarse wavelength division multiplexed, intensity modulated optical signals at stage 770. In some implementations, the transceiver is coupled to a controller configured to cause the transceiver to switch between receiver and transmission modes.

The technology described herein has advantageous benefits. For example, by creating a transceiver that is backward compatible, data center networking costs can be significantly reduced over the long term. In addition, an integrated optical switch is employed to redirect optical power in a photonic integrated circuit to achieve coherent and IM operations using shared components. The use of shared components allows for smaller form factors and further reduced cost. Moreover, the technology described herein includes a fully integrated solution using a single photonic circuit that can function both as a coherent transceiver and as a IM-DD transceiver. As a result, this coherent transceiver can offer backward compatibility with a traditional PAM transceiver.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A photonic integrated chip (PIC) comprising:
a receiver section configured to receive both coherently modulated and intensity modulated optical signals and to be optically switched between a first receiver mode for direct detection and a second receiver mode for coherent detection;

a transmitter section comprising a nested Mach-Zehnder Modulator or a polarization multiplexed quad Mach-Zehnder Modulator configured to be operated in a first transmission mode to output an intensity modulated optical signal and a second transmission mode to output a coherently modulated optical signal.

2. The PIC of claim 1, wherein the receiver section detects both the coherently modulated and intensity modulated optical signals using at least one common photodiode.

3. The PIC of claim 2, wherein the photodiode comprises a waveguide photodiode.

4. The PIC of claim 1, coupled to a digital signal processor (DSP) for decoding the received coherently modulated and intensity modulated optical signals.

5. The PIC of claim 1, comprising an optical switch configured to selectively direct a received optical signal down a direct detection optical circuit or a coherent detection optical circuit based on a control signal applied to the optical switch.

6. The PIC of claim 1, wherein the nested Mach-Zehnder Modulator comprises a controllable phase shifter coupled to one Mach-Zehnder Modulator in the nested Mach-Zehnder Modulator, wherein in the first transmission mode, the controllable phase shifter implements a first phase shift and in the second transmission mode, the controllable phase shifter implements a second phase shift.

7. The PIC of claim 6, wherein the controllable phase shifter comprises a heater configured to introduce a thermo-optic phase shift in the output of the one Mach-Zehnder Modulator.

8. The PIC of claim 6, wherein the first phase shift is a zero phase shift and the second phase shift is a $\pi/2$ phase shift.

9. The PIC of claim 1, comprising at least one demultiplexer coupled to the receiver section for receiving coarse wavelength division multiplexed, intensity modulated optical signals and a multiplexer coupled to the transmitter section to transmit coarse wavelength division multiplexed, intensity modulated optical signals.

10. The PIC of claim 1, wherein the PIC is coupled to a controller configured to cause the PIC to switch between receiver and transmission modes.

11. A method of operating comprising:
providing a source configured for generating optical signals;
providing a transceiver comprising:
a receiver section configured to receive both coherently modulated and intensity modulated optical signals and to be optically switched between a first receiver mode and a second receiver mode, and
a transmitter section comprising a nested Mach-Zehnder Modulator or a polarization multiplexed quad Mach-Zehnder Modulator configured to be operated in a first transmission mode and a second transmission mode;
transmitting, via the transmitter section, in the first transmission mode an intensity modulated optical signal or in the second transmission mode a coherently modulated optical signal; and
receiving an optical signal, via the receiver section, in the first receiver mode for direct detection or in the second receiver mode for coherent detection.

12. The method of claim 11, wherein receiving includes detecting both the coherently modulated and intensity modulated optical signals using at least one common photodiode.

13. The method of claim 12, wherein the photodiode comprises a waveguide photodiode.

14. The method of claim 11, comprising decoding the received coherently modulated and intensity modulated optical signals using a digital signal processor (DSP).

15. The method of claim 11, comprising selectively directing using an optical switch a received optical signal down a direct detection optical circuit or a coherent detection optical circuit based on a control signal applied to the optical switch.

16. The method of claim 11, wherein the nested Mach-Zehnder Modulator comprises a controllable phase shifter coupled to one Mach-Zehnder Modulator in the nested Mach-Zehnder Modulator, wherein in the first transmission mode, the controllable phase shifter implements a first phase shift and in the second transmission mode, the controllable phase shifter implements a second phase shift.

17. The method of claim 16, wherein the controllable phase shifter comprises a heater configured to introduce a thermo-optic phase shift in the output of the one Mach-Zehnder Modulator.

18. The method of claim 16, wherein the first phase shift is a zero phase shift and the second phase shift is a $\pi/2$ phase shift.

19. The method of claim 11, comprising demultiplexing received coarse wavelength division multiplexed, intensity modulated optical signals and transmitting coarse wavelength division multiplexed intensity modulated optical signals.

20. The method of claim 11, further comprising switching between receiver and transmission modes in response to a controller command.

21. A transceiver comprising:
a receiver section configured to receive both coherently modulated and intensity modulated optical signals and to be optically switched between a first receiver mode for direct detection and a second receiver mode for coherent detection;
a transmitter section comprising an optical modulator configured to be operated in a first transmission mode to output an intensity modulated optical signal and a second transmission mode to output a coherently modulated optical signal; and
a digital signal processor (DSP) for decoding the received coherently modulated and intensity modulated optical signals.

22. The transceiver of claim 21, wherein the optical modulator comprises a nested Mach-Zehnder Modulator or a polarization multiplexed quad Mach-Zehnder Modulator.

23. The transceiver of claim 22, wherein the nested Mach-Zehnder Modulator comprises a controllable phase shifter coupled to one Mach-Zehnder Modulator in the nested Mach-Zehnder Modulator, wherein in the first transmission mode, the controllable phase shifter implements a first phase shift and in the second transmission mode, the controllable phase shifter implements a second phase shift.

24. The transceiver of claim 21, wherein the transceiver is coupled to a controller configured to cause the transceiver to switch between receiver and transmission modes.

* * * * *